US 11,785,715 B2

(12) United States Patent
Hustedt

(10) Patent No.: US 11,785,715 B2
(45) Date of Patent: Oct. 10, 2023

(54) ARTICLE FOR POWER INVERTER AND POWER INVERTER

(71) Applicant: Exro Technologies Inc., Calgary (CA)

(72) Inventor: Eric Hustedt, Calgary (CA)

(73) Assignee: Exro Technologies Inc., Calgary (CA)

( * ) Notice: Subject to any disclaimer, the term of this patent is extended or adjusted under 35 U.S.C. 154(b) by 0 days.

(21) Appl. No.: 18/066,473

(22) Filed: Dec. 15, 2022

(65) Prior Publication Data

US 2023/0199952 A1 Jun. 22, 2023

Related U.S. Application Data

(60) Provisional application No. 63/290,712, filed on Dec. 17, 2021.

(51) Int. Cl.
*H05K 1/11* (2006.01)
*H05K 1/18* (2006.01)
*H02M 7/00* (2006.01)

(52) U.S. Cl.
CPC ............ *H05K 1/111* (2013.01); *H02M 7/003* (2013.01); *H05K 1/181* (2013.01); *H05K 2201/09227* (2013.01); *H05K 2201/09409* (2013.01); *H05K 2201/10166* (2013.01); *H05K 2201/10522* (2013.01)

(58) Field of Classification Search
CPC .............. H05K 1/111; H05K 1/181; H05K 2201/09227; H05K 2201/09409; H05K 2201/10166; H05K 2201/10522; H02M 7/003
See application file for complete search history.

(56) References Cited

U.S. PATENT DOCUMENTS

| 4,503,369 A | 3/1985 | Nishijima et al. |
| 4,558,268 A | 12/1985 | Besson et al. |

(Continued)

FOREIGN PATENT DOCUMENTS

| WO | 2021176431 A1 | 9/2021 |
| WO | 2022236424 A1 | 11/2022 |

OTHER PUBLICATIONS

International Search Report and Written Opinion for PCT/CA2022/051828, dated Mar. 22, 2023, in 8 pages.

(Continued)

*Primary Examiner* — Steven T Sawyer
(74) *Attorney, Agent, or Firm* — Cozen O'Connor

(57) ABSTRACT

An article for a power inverter, includes a multilayer printed circuit board having a first and second electrically conductive wiring layer and at least a first dielectric layer interposed between the first and second electrically conductive wiring layers. Each conductive wiring layer includes a common input and output line, the common input and output lines at least partially overlapping one another in a projection along a thickness of the multilayer printed circuit board. A set of input mounting pads is carried by the first common input line and a set of input mounting pads is carried by the second common input line, the input mounting pads of the second set of input mounting pads are interleaved with the input mounting pads of the first set of input mounting pads along a first axis. The article further includes a set output mounting pads carried by the common output line.

11 Claims, 7 Drawing Sheets

(56) References Cited

U.S. PATENT DOCUMENTS

| | | | |
|---|---|---|---|
| 5,844,783 A * | 12/1998 | Kojima | H05K 1/0219 |
| | | | 361/826 |
| 6,246,205 B1 | 6/2001 | Kujira et al. | |
| 6,906,489 B2 | 6/2005 | Fukamizu et al. | |
| 6,914,855 B2 | 7/2005 | Stotz et al. | |
| 6,952,086 B1 | 10/2005 | Krefta et al. | |
| 6,989,658 B2 | 1/2006 | Allwang et al. | |
| 7,129,671 B2 | 10/2006 | Fukamizu et al. | |
| 8,441,826 B2 | 5/2013 | Kroeze et al. | |
| 9,667,122 B1 | 5/2017 | Huang et al. | |
| 9,991,838 B2 | 6/2018 | Yue | |
| 10,532,764 B2 | 1/2020 | Sakashita | |
| 2009/0008131 A1* | 1/2009 | Shibata | H05K 1/118 |
| | | | 174/254 |
| 2019/0067160 A1 | 2/2019 | Xu et al. | |
| 2019/0363660 A1 | 11/2019 | Mao | |
| 2020/0076345 A1 | 3/2020 | Ritchey | |
| 2020/0200617 A1* | 6/2020 | Toyoshima | G01L 5/00 |
| 2021/0376707 A1 | 12/2021 | McDonald et al. | |
| 2022/0304149 A1* | 9/2022 | Qiao | H05K 1/117 |

OTHER PUBLICATIONS

International Search Report and Written Opinion for PCT/CA2022/051830, dated Feb. 17, 2023, 9 pages.

\* cited by examiner

ARTICLE FOR POWER INVERTER AND POWER INVERTER

CROSS REFERENCE TO RELATED APPLICATION

The present application for patent claims the benefit of U.S. Provisional Application No. 63/290,712 filed Dec. 17, 2021, and expressly incorporated by reference herein.

TECHNICAL FIELD

The present disclosure generally relates to power inverters and more particularly to power inverter fabrications than can reduce or even eliminate voltage overshoots.

BACKGROUND

Description of the Related Art

Voltage source inverters (VSI) utilize an energy storage component on a DC link to provide a fixed, low AC impedance, DC voltage to the switching elements. The storage element is generally a capacitor, but can also be other voltage sources, for example a lithium ion battery, or the like. The DC voltage is then applied to a load via switches to generate the desired output voltage via variable ON time, fixed frequency, i.e., duty cycle, or less typically a combination of variable ON time and variable frequency. The switches are generally semiconductor devices.

During switching action of an inverter half bridge delivering a load current that is lower than the switching frequency, at any switching instant, the current does not change direction or significantly change amplitude because there is an inductive load current and an inductor time constant is large with respect to switching time. The loop inductance within the bridge (not to be confused with the load inductance) puts a limit on switching speed due to the voltage overshoot generated during switching. Typically, loop inductance is considered a critical parameter for inverter design. Typically low inductance designs are employed which allow for faster switching speeds. Faster switching speeds can result in lower switching loss.

BRIEF SUMMARY

Power inverter designs typically employ a physical separation between a high-side (e.g., high-side input line and high-side switches connected to a positive terminal of a power source) and a low-side (e.g., low-side input line and low-side switches connected to a negative terminal of the power source). When current flow changes from a high-side input line to a low-side input line by turning the high-side switches OFF and the low-side switches ON, any energy in the high-side input line (i.e., an inductance magnetic field) must dissipate to zero. Likewise, when current flow changes from a low-side input line to a high-side input line by turning the low-side switches OFF and the high-side switches ON, any energy in the low-side input line (i.e., an inductance magnetic field) must dissipate to zero. This collapsing of the field adversely creates instances of an over voltage condition. The over voltage limits the turn OFF time of the current carrying switches and/or other current carrying devices. It is typical to employ a low inductance design and/or low limit switching time to reduce the amplitude of over voltage conditions.

For a circuit layout in which the electrical conductors are spaced far enough apart, the electrical conductors do not couple with one another. A current in, for example, the high-side (e.g., positive side) of the circuit, generates its own local magnetic field, which is a source of energy that will have to be dissipated. When the high-side (e.g., positive side) current stops, that energy has to be dissipated in the form of voltage. In addition, the same field must be built up in the negative side, the collapsing field in one side and the corresponding increasing field on the other combine to generate the total over shoot voltage.

Over voltage can also be mitigated by creating mutual electromagnetic coupling between the high-side (e.g., positive side) and the low-side (e.g., negative side) electrical conductors, where the electromagnetic field created by the current through the high-side (e.g., positive side) conductor envelops the low-side (e.g., negative side) electrical conductor such that when the current changes from the high-side (e.g., positive side) electrical conductor to the low-side (e.g., negative side) electrical conductor, the electromagnetic field does not need to change. This technique advantageously reduces the voltage overshoot without compromising switching speed.

Therefore, instead of employing a low inductance design, an electromagnetically coupled design is used with alternating high-side and low-side devices. This means the inductance need not be minimized because the electromagnetic coupling limits the energy release during a switch transition.

When the electrical conductors for the high-side (e.g., positive side) and the low-side (e.g., negative side) are close and substantially parallel to each other, or at least partially overlap one another, electromagnetic coupling between the electrical conductors will occur as current passes through the electrical conductors. When the high-side electrical conductor and low-side electrical conductor are electromagnetically coupled as current flows in the side that is ON, either the high-side or the low-side, a magnetic field is generated on the side that is OFF. In this situation, when it is time to change the side that is ON, via switching (i.e., high-side to low-side or vice versa), because there is mutual inductance, the resulting mutual field does not need to change. The mutual inductance eliminates or at least dramatically reduces the total loss of energy from the total generated magnetic field during the switch transition, this then reduces the corresponding voltage generated in the switch network, allowing very fast switching times.

The mutual inductance eliminates the need to deal with the collapse of the magnetic field. With a physical design in which the high-side and low-side are coupled the field is constant so there is not a need to compensate for a generated voltage.

An article for a power inverter can be summarized as including: a multilayer printed circuit board comprising a first electrically conductive wiring layer, at least a second electrically conductive wiring layer, and at least a first dielectric layer interposed between the first and the second electrically conductive wiring layers, the first electrically conductive wiring layer comprising a first common input line and the second electrically conductive wiring layer comprising a second common input line, the first and the second common input lines at least partially overlapping one another in a projection along a thickness of the multilayer printed circuit board, a first set of input mounting pads carried by the first common input line, a second set of input mounting pads carried by the second common input line; the input mounting pads of the second set of input mounting pads alternatingly interleaved with the input mounting pads of the first set of input mounting pads along a first axis, the first axis which is perpendicular to the thickness of the multilayer printed circuit board, the article further comprising a common output line and a set output mounting pads carried by the common output line.

According to one aspect of the invention, the first and the second common input lines completely overlap one another in a projection along a thickness of the multilayer printed circuit board.

The second electrically conductive wiring layers can be spaced sufficiently close to the first electrically conductive wiring layer to electromagnetically couple the first and the second electrically conductive wiring layers together when a current flows through at least one of the second electrically conductive wiring layers.

The first common output line can be interdigitated along a first edge thereof and exposes portions of the second common output line between digits of the first common input line. The input mounting pads of the first set of input mounting pads can be carried on respective ones of the digits of the first common input line and the mounting pads of the second set of input mounting pads can be carried are the exposed portions of the second common output line. The output mounting pads of the set of output mounting pads Can be spaced from the input mounting pads of the first and the second sets of input mounting pads along a second axis, the second axis orthogonal to the first axis and the thickness of the multilayer printed circuit board.

According to one aspect of the invention, the printed circuit board can be manufactured using direct bonded copper (DBC) technology, active metal braze (AMB) technology, insulated metal substrate (IMS) technology, flexible substrate technology using Kapton or the like, and ceramic substrates constructed with thick film or thin film technologies.

The article can further include: a first set of semiconductor switches, each of the semiconductor switches of the first set of semiconductor switches having a first node and a second node, the first node of the semiconductor switches of the first set electrically coupled to respective ones of one or more of the input mounting pads of the first set of input mounting pads, and the second node of the semiconductor switches of the first set electrically coupled to respective ones of one or more of the output mounting pads of the set of output mounting pads; and a second set of semiconductor switches, each of the semiconductor switches of the second set of semiconductor switches having a first node and a second node, the first node of the semiconductor switches of the second set electrically coupled to respective ones of one or more of the input mounting pads of the second set of input mounting pads, and the second node of the semiconductor switches of the second set electrically coupled to respective ones of one or more of the output mounting pads of the set of output mounting pads.

The at least one of the first or the second electrically conductive wiring layer can comprises the common output line, the common output line electrically isolated from the first and the second common input lines except via the semiconductor switches of the first and the second sets of semiconductor switches.

The multilayer printed circuit board can include at least a third electrically conductive wiring layer, and at least a second dielectric layer interposed between the third first electrically conductive wiring layer and at least one of the first or the second electrically conductive wiring layers, the third electrically conductive wiring layer comprising the common output line which is electrically isolated from the first and the second common input lines except via the semiconductor switches of the first and the second sets of semiconductor switches. The article can further include a controller communicatively coupled to provide control signals to the semiconductor switches of the first and the second sets of semiconductor switches, the controller which provides control signals to places the semiconductor switches of the second set of semiconductor switches in the opposite state from the semiconductor switches of the first set of semiconductor switches. The semiconductor switches of the first and the second sets of semiconductor switches can, for example, take the form of integrated gate bipolar transistors (IGBTs) or metal oxide semiconductor field effect transistors (MOSFETs).

According to one aspect of the invention, the disclosed multilayer printed circuit board comprises, in the height direction of the multilayer printed circuit board, alternating positive and negative planes with respective conductors connected to interdigitated high side (HS) and low side (LS) switching devices. The alternating positive and negative planes and alternating high-side and low-side devices are arranged to ensure currents in the respective conductors flow over the tops of each other in the planes, creating a mutual coupling. In other words, the respective conductors in the alternating positive and negative planes at least partially overlap one another in the height direction of the multilayer printed circuit board. According to one aspect of the invention, the respective conductors in the alternating positive and negative planes completely overlap one another in the height direction of the multilayer printed circuit board.

According to one aspect of the invention, the disclosed printed circuit board comprises:
  a multilayer printed circuit board comprising a dielectric material and at least two conductor layers;
  the conductor layers comprise:
  a plurality of individual mounting pads for high-side switches;
  a plurality of individual mounting pads for low-side switches;
  a first common output line for the high-side switches; and
  a second common output line for the low-side switches,
    wherein the first common output line and the second common output line at least partially overlap in a height direction of the printed circuit boards, and the individual mounting pads for high-side switches and the individual mounting pads for low-side switches are alternatingly arranged.

According to one aspect of the invention, the multilayer printed circuit board comprises:
  a first common input line for the high-side switches; and
  a second common input line for the low-side switches,
    wherein the first common input line and the second common input line at least partially overlap in the height direction of the printed circuit boards.

According to one aspect of the invention, the mounting pads for the high-side switches are arranged on a first side of the overlapping first and second common output lines and the mounting pads for the low-side switches are arranged on a second side of the overlapping first and second common output lines opposite the first side of the overlapping first and second common output lines, the mounting pads for high-side switches and the mounting pads for low-side switches being alternatingly arranged.

According to one aspect of the invention, the mounting pads for the high-side switches are arranged on a first face of the printed circuit board and the mounting pads for the low-side switches are arranged on a second face of the printed circuit board opposite the first face of the printed circuit board.

According to one aspect of the invention, the mounting pads for the high-side switches are arranged on a first face of the printed circuit board and the output pads for the low-side switches are arranged on a second face of the printed circuit board opposite the first face of the printed circuit board.

According to one aspect of the invention, the multilayer printed circuit board comprises the dielectric material and at least four conductor layers.

According to one aspect of the invention, the overlapping first and second common input and/or output lines are distributed on the at least four conductor layers.

According to one aspect of the invention, a disclosed inverter comprises:
- a plurality of high-side switches;
- a plurality of low-side switches;
- a multilayer printed circuit board comprising a dielectric material and at least two conductor layers;
- the conductor layers comprising:
  - a respective mounting pad for each of the plurality of high-side switches;
  - a respective mounting pad for each of the plurality of low-side switches alternatingly arranged with the plurality of high-side mounting pads;
  - first common input and output lines for the plurality of high-side switches; and
  - second common input and output lines for the plurality of low-side switches,
- wherein at least part of the first common input and output lines and the second common input and output lines at least partially overlap in a height direction of the printed circuit boards.

According to one aspect of the invention, the high-side switches and the low-side switches are switching devices.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one implementation" or "an implementation" or to "one embodiment" or "an embodiment" means that a particular feature, structure or characteristic described in connection with the implementation or embodiment is included in at least one implementation or embodiment. Thus, the appearances of the phrases "in one implementation" or "in an implementation" or "in one embodiment" or "in an embodiment" in various places throughout this specification are not necessarily all referring to the same implementation or embodiment. Furthermore, the particular features, structures, or characteristics may be combined in any suitable manner in one or more implementations or one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The terms input traces, input lines, input buses, or input rails are used interchangeably herein. The term high-side generally refers to the relatively higher electrical potential, for example a side or component electrically coupled to a positive node or pole of a voltage source, while the term low-side generally refers to the relatively lower electrical potential, for example a side or component electrically coupled to a negative node or pole of a voltage source.

The headings and Abstract of the Disclosure provided herein are for convenience only and do not interpret the scope or meaning of the embodiments.

Figure 1:
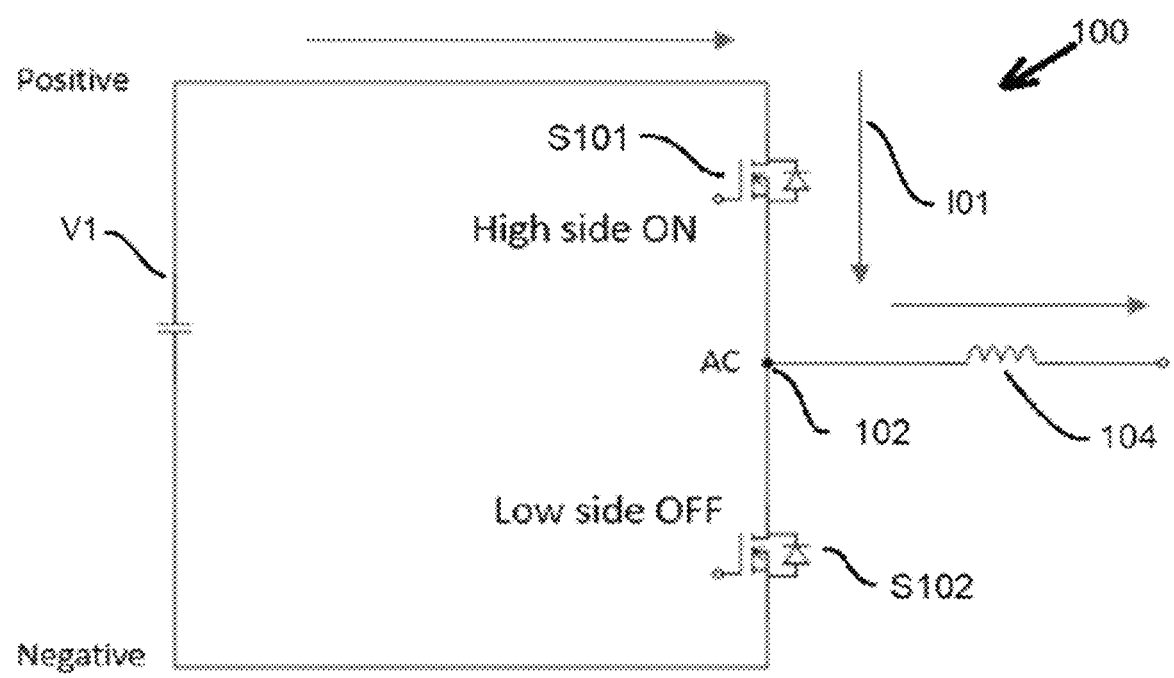
FIG. 1 is a schematic diagram of at least a portion of an inverter circuit in the form of a half bridge illustrated in a first state with a high-side switch in an ON state and a low-side switched in an OFF state.
Figure 2:
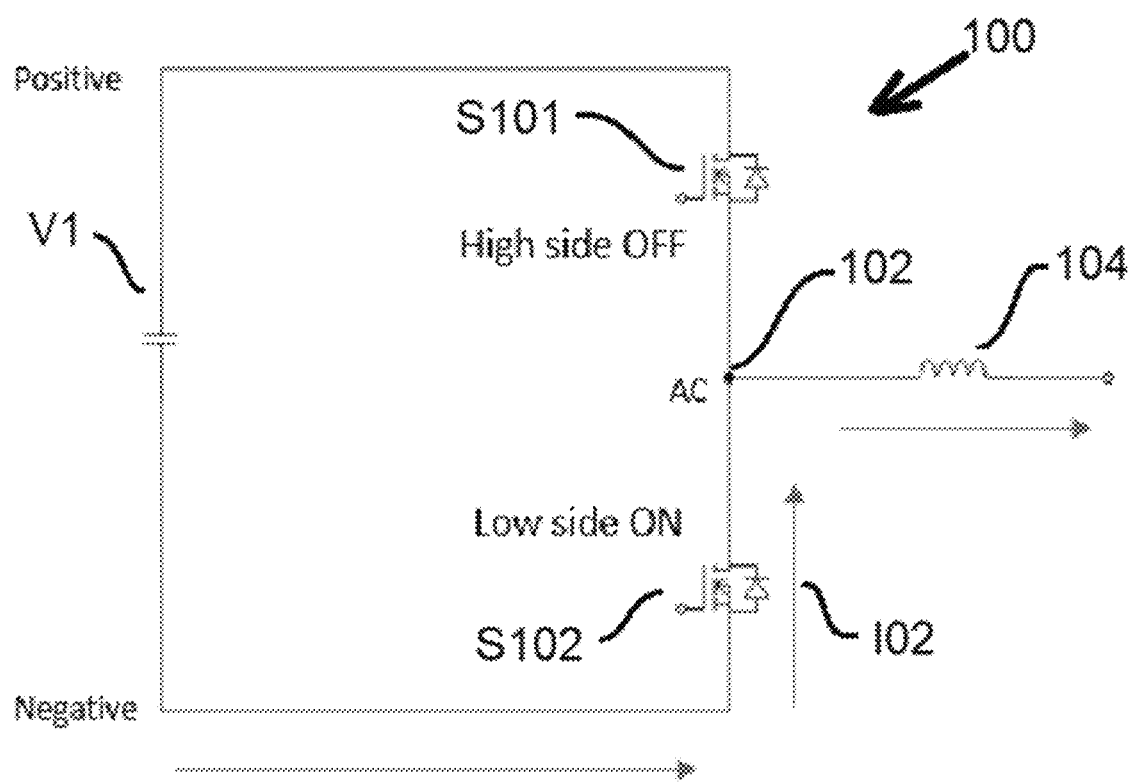
FIG. 2 is a schematic diagram of at least a portion of the inverter circuit of FIG. 1, illustrated in a second state with a high-side switch in an OFF and a low-side switched in an ON state.

FIG. 1 shows an inverter circuit 100 in a first state. FIG. 2 shows the inverter circuit 100 in a second state. The inverter circuit 100 is illustrated as a half bridge topology with a first or "high-side" switch S101 electrically coupled between a "high-side" or positive node of a voltage source V1 and an output or "AC" node 102, and a second or "low-side" switch S102 electrically coupled between a "low-side" or negative node of the voltage source V1 and the output or "AC" node 102. The inverter circuit 100 can be combined with other Half bridge circuits to form a full H-bridge topology or 3-phase bridge or other imagined circuits comprising of multiple half bridges. The high-side switch S101 and low-side switch S102 can take the form of semiconductor switches, for example bipolar transistors, insulated gate bipolar transistors (IGBTs), field effect transistors (FETs), or metal oxide semiconductor field effect transistors (MOSFETs) including GAN and SiC technologies. While illustrated as single switches S101, S102, in some implementations the high-side switch S101 can take the form of two or more parallel or serial switches and the low-side switch S101 can take the form of two or more parallel or serial switches. While high-side and low-side switches S101, S102 can be switched (i.e., turned ON and OFF) independently from one another, in typical operation control signals are provide such that the high-side switch S101 and the low-side switch S102 are in opposite states from one another. Further, when multiple switches are used in parallel, the timing for each switch can be varied so the turn on or turn off times can be offset from one another. Generally, when the high-side switch S101 is in an ON state and the low-side switch S102 is in an OFF state, current I01 flows through a loop of the inverter circuit 100 along a first path in a first direction (e.g., clockwise) to a load (e.g., inductance 104) via the output or AC node 102. Conversely, when the low-side switch S102 is in an ON state and the high-side switch S101 is in an OFF state, the reverse happens, current I102 flows through the loop of the inverter circuit 100 along a second path in a second direction (e.g., counter clockwise) to the load, the second direction a reverse direction with respect to the first direction. The inverter circuit 100 provides at least one of rectification and/or regulation of the current.

The inverter circuit rectifies a negative voltage (e.g., negative grid voltage) to a positive voltage. For this application, a switching frequency for the high-side and low-side switches S101, S102 is preferably twice a grid frequency, resulting in substantially reduced switching loss, which are otherwise substantial in a regular switching mode inverter.

Figure 3A:
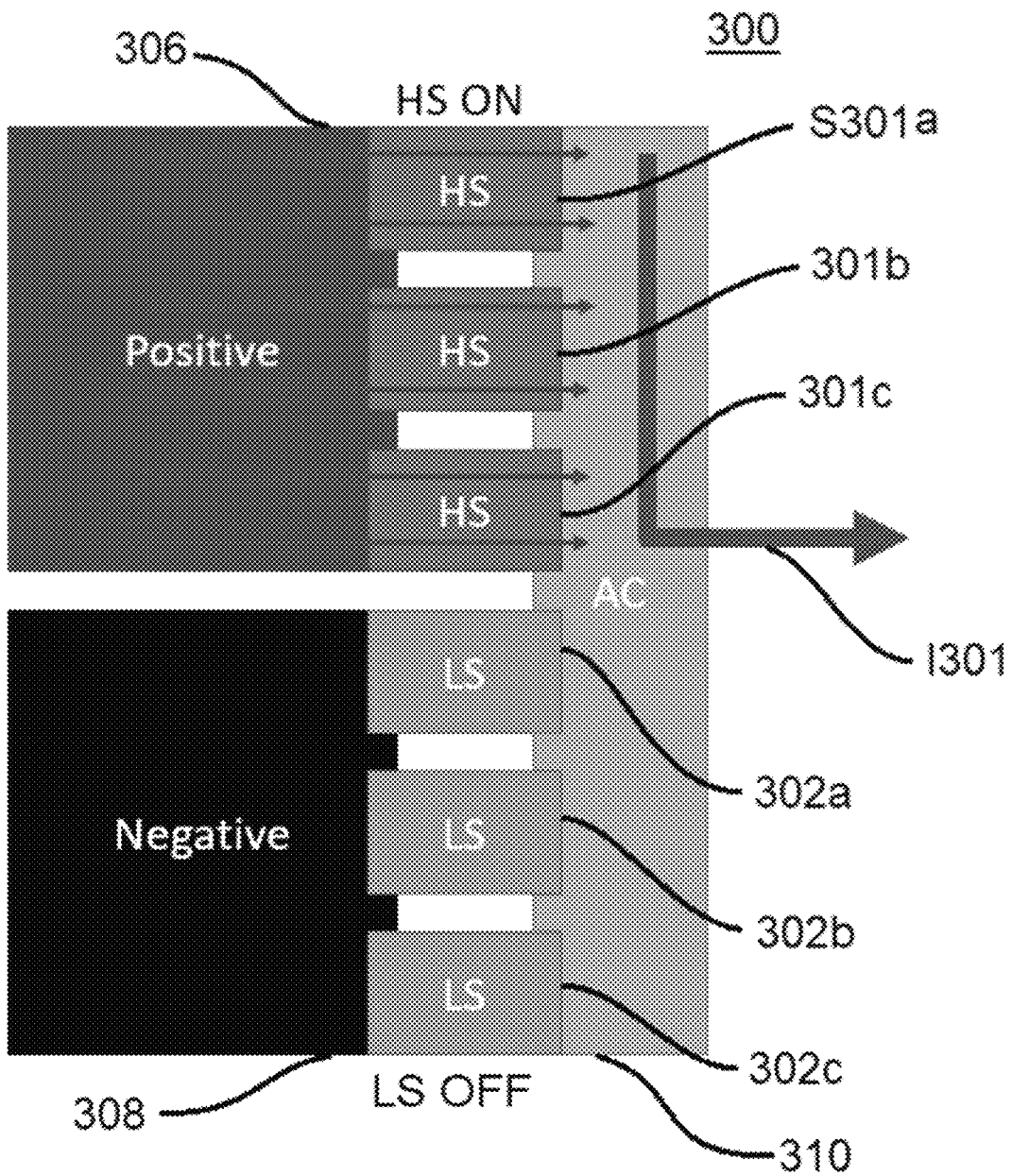
FIG. 3A is a top plan view of at least a portion of a printed circuit board with a plurality of high-side switches electrically coupled in parallel and a plurality of low-side switches electrically coupled in parallel which can implement a half bridge of an inverter, with arrows illustrating a flow of current in a first state with the plurality of high-side switches in an ON state and the plurality of low-side switches in an OFF state.
Figure 3B:
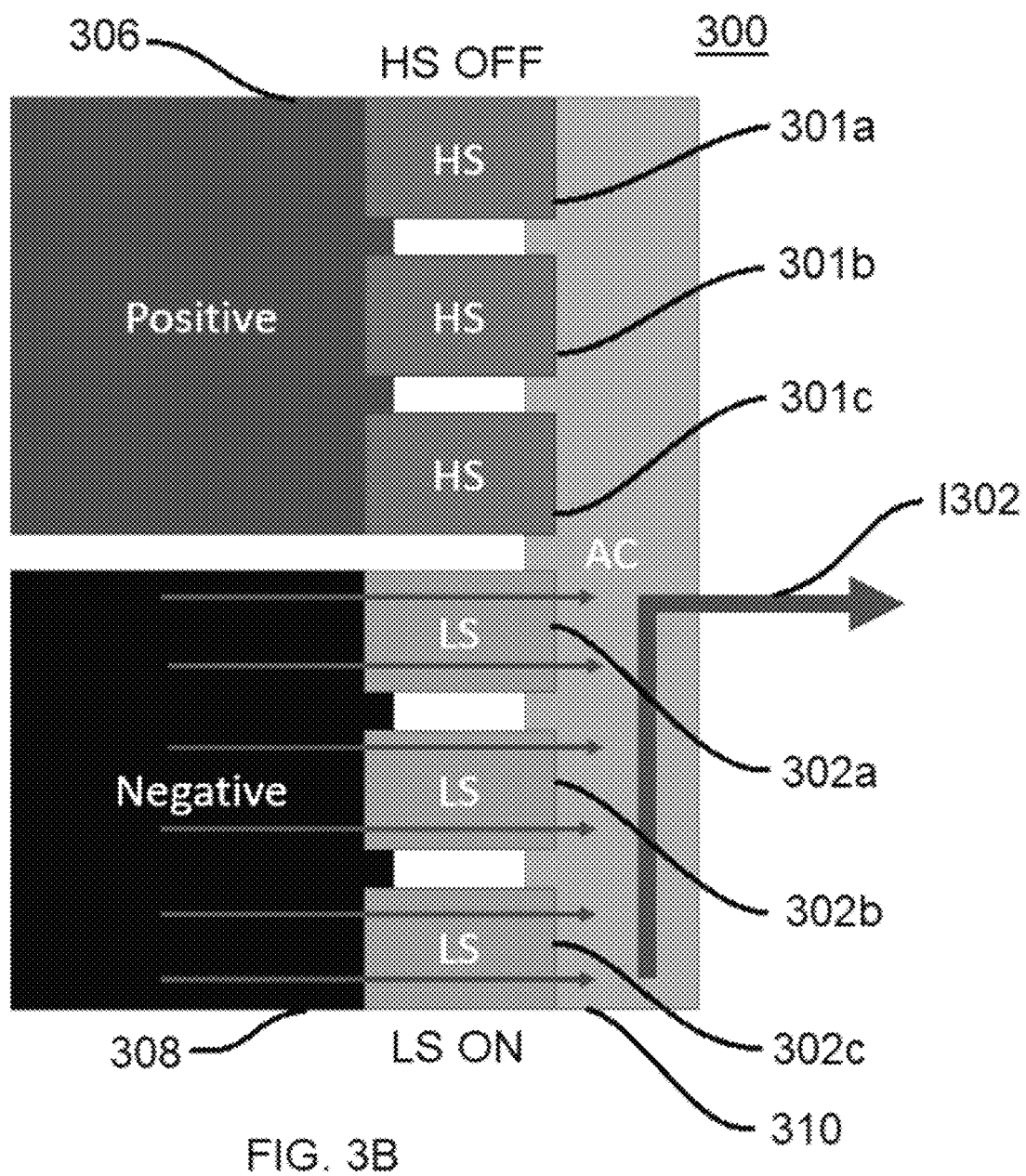
FIG. 3B is a top plan view of at least the portion of the printed circuit board of FIG. 3A, with arrows illustrating a flow of current in a second state with the plurality of high-side switches in an OFF state and the plurality of low-side switches in an ON state.

FIGS. 3A and 3B show at least a portion of a printed circuit board 300 with a plurality of high-side switches S301a, S301b, S301c (three shown, collective S301) electrically coupled in parallel with one another and a plurality of low-side switches S302a, S302b, S302c (three shown, collective S302) electrically coupled in parallel with one another, which can implement a power module in the form of a half bridge of an inverter. In particular, FIG. 3A shows a current flow I301 in a first state with the plurality of high-side switches S301 in an ON state and the plurality of low-side switches S302 in an OFF state. In particular, FIG. 3B shows a current flow I302 in a second state with the plurality of low-side switches S302 in an ON state and the plurality of high-side switches S301 in an OFF state.

The printed circuit board 300 includes a high-side input bus 306 and a low-side input bus 308, which may be formed in or by an electrically conductive wiring layer of the printed circuit board 300. Notably, the high-side input bus 306 and a low-side input bus 308 are arranged in tandem across a width or length of the printed circuit board 300, electrically isolated from one another and spaced from one another sufficiently to prevent electromagnetic coupling therebetween. The printed circuit board 300 also includes an output or AC bus 310, which may be formed in or by an electrically conductive wiring layer of the printed circuit board 300. The high-side switches S301a, S301b, S301c electrically couple the high-side input bus 306 to the output or AC bus 310 when in an ON state. The low-side switches S302a, S302b, S302c electrically couple the low-side input bus 308 to the output or AC bus 310 when in an ON state.

As is illustrated, the positive or high-side components (i.e., high-side input bus 306, high-side switches S301a, S301b, S301c) are grouped together and the negative or low-side components (i.e., low-side input bus 308, low-side switches S302a, S302b, S302c) are grouped together. In FIG. 3A the positive or high-side switches S301a, S301b, S301c are ON and the negative or low-side switches S302a, S302b, S302c are OFF. As shown in FIG. 3A, the current I301 flows through the positive or high-side input bus 306 and high-side switches S301a, S301b, S301c in a first direction (e.g., clockwise). As shown in FIG. 3B, the current I302 flows through the negative or low-side input bus 308 and low-side switches S302a, S302b, S302c in a second direction (e.g., counterclockwise).

In operation, assume that initially the high-side switches S301a, S301b, S301c are in an ON state and the low-side switches S302a, S302b, S302c are in an OFF state. Thus, current I301 flows out of the high-side switches S301a, S301b, S301c and out of the half-bridge. Then, the high-side switches S301a, S301b, S301c are turned OFF and the low-side switches S302a, S302b, S302c are turned ON. The current in the high-side is turned off and the current in the low-side is turned on. These conducting currents I301, I302 generate magnetic fields. The stored energy in the magnetic fields is a significant problem with fast switching of inverters because the energy stored due to the generated magnetic field has to be dissipated. The magnetic field is specified or set by the physical layout of the components. The mechanical structures and physical layouts for the devices of FIGS. 3A and 3B are designed to reduce loop inductances in the two or more voltages generator devices being switched.

Instead of only minimizing loop inductance, circuit performance can be improved if the magnetic field is not formed or if a magnitude of the magnetic field that is generated is kept to a minimum. Minimizing the magnetic field also reduces switch cost.

Figure 4A:
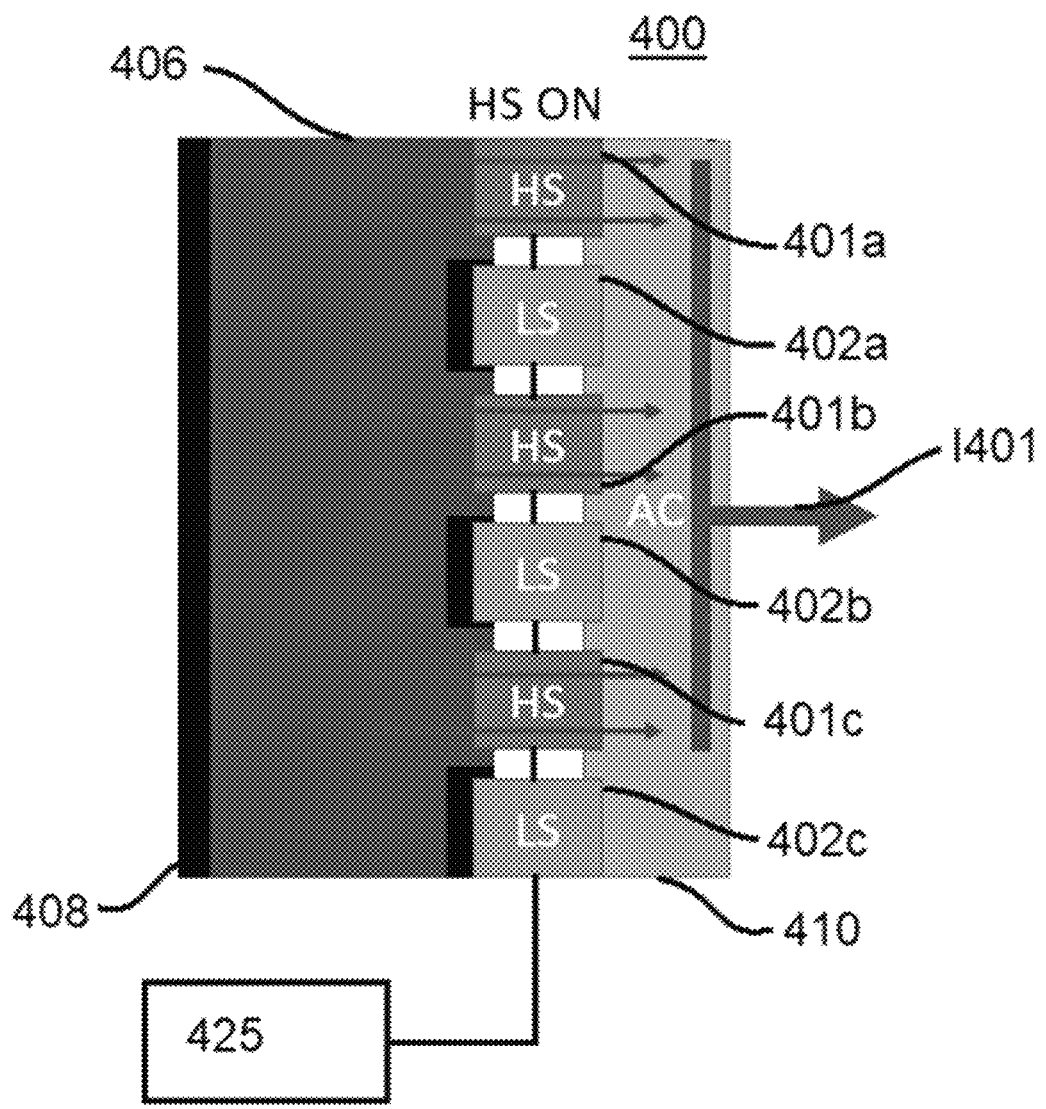
FIG. 4A is a top plan view of at least a portion of a printed circuit board according to at least one illustrated implementation, with at least partially overlapping high-side low-side input lines, and a plurality of high-side switches electrically coupled in parallel and a plurality of low-side switches electrically coupled in parallel and interleaved with the high-side switches, which can implement a half bridge of an inverter, with arrows illustrating a flow of current in a first state with the plurality of high-side switches in an ON state and the plurality of low-side switches in an OFF state.
Figure 4B:
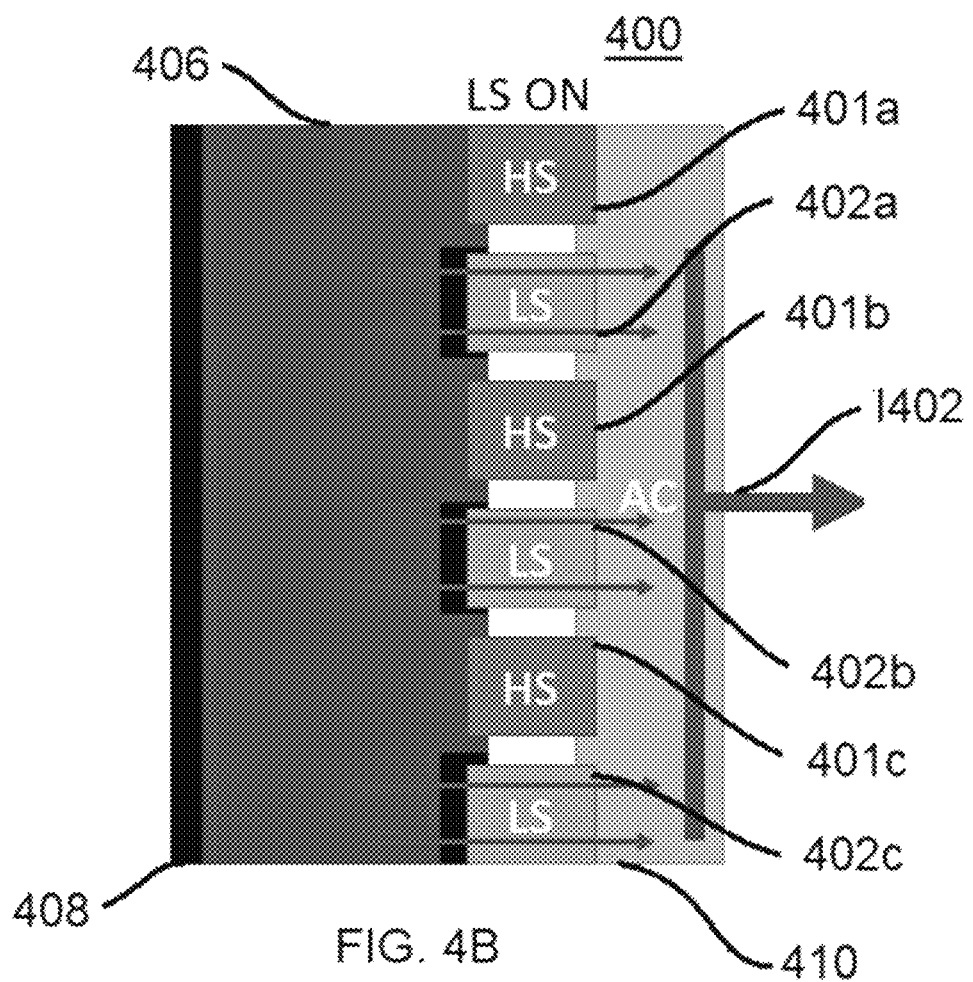
FIG. 4B is a top plan view of at least the portion of the printed circuit board of FIG. 4A, with arrows illustrating a flow of current in a second state with the plurality of high-side switches in an OFF state and the plurality of low-side switches in an ON state.

As illustrated in FIGS. 4A and 4B, instead of designing and manufacturing an article where the circuit traces are spaced from each other to minimize electromagnetic coupling, the circuit traces, particularly the input traces, input lines or input buses, are spaced sufficiently near each other so that those input traces, input lines or input buses are electromagnetically coupled during operation and the high-side and low-side switched are interleaved. According to at least one implementation, at least the input traces or input or input buses at least partially overlap one another in a projection of the boundaries of those input traces or input buses along an axis that defines a thickness of a printed circuit board. The electromagnetic coupling or mutual inductance, which does not occur if the electrical conductors are too far apart, improves switching characteristics.

FIGS. 4A and 4B show at least a portion of a printed circuit board 400 with a plurality of high-side switches S401a, S401b, S401c (three shown, collective S401) electrically coupled in parallel with one another and a plurality of low-side switches S402a, S402b, S402c (three shown, collective S402) are alternatingly arranged and electrically coupled in parallel with one another, which can implement a power module in the form of a half bridge of an inverter. In particular, FIG. 4A shows a current flow I401 in a first state with the plurality of high-side switches S401 in an ON state and the plurality of low-side switches S402 in an OFF state. In particular, FIG. 4B shows a current flow I402 in a second state with the plurality of low-side switches S402 in an ON state and the plurality of high-side switches S401 in an OFF state.

The printed circuit board 400 includes a high-side input bus 406 and a low-side input bus 408, which may be formed in or by an electrically conductive wiring layer of the printed circuit board 400. As shown, the high-side input bus 406 and the low-side input bus 408 are different conductive layers of the printed circuit board 400. Notably, the high-side input bus 406 and the low-side input bus 408 are arranged across a width or length of the printed circuit board 400, electrically isolated from one another and spaced from one another. The printed circuit board 400 also includes an output or AC bus 410, which may be formed in or by an electrically conductive wiring layer of the printed circuit board 400. The high-side switches S401a, S401b, S401c electrically couple the high-side input bus 406 to the output or AC bus 410 when in an ON state. The low-side switches S402a, S402b, S402c electrically couple the low-side input bus 408 to the output or AC bus 410 when in an ON state.

As is illustrated, the positive or high-side components (e.g., high-side switches S401a, S401b, S401c) are interleaved or alternative successively arranged with the negative or low-side components (e.g., low-side switches S402a, S402b, S402c). In FIG. 4A the positive or high-side switches S401a, S401b, S401c are ON and the negative or low-side switches S402a, S402b, S402c are OFF. As shown in FIG. 4A, the current I401 flows through the positive or high-side input bus 406 and high-side switches S401a, S401b, S401c. In FIG. 4B the positive or high-side switches S401a, S401b, S401c are OFF and the negative or low-side switches S402a, S402b, S402c are ON. As shown in FIG. 4B, the current I402 flows through the negative or low-side input bus 408 and low-side switches S402a, S402b, S402c.

In operation, assume that initially the high-side switches S401a, S401b, S401c are in an ON state and the low-side switches S402a, S402b, S402c are in an OFF state. Thus, current I401 flows out of the high-side switches S401a, S401b, S401c and out of the half-bridge. Then, the high-side switches S401a, S401b, S401c are turned OFF and the low-side switches S402a, S402b, S402c are turned ON. The current in the high-side is turned OFF and the current in the low-side is turned ON. These conducting currents I401, I402 generate magnetic fields. Circuit performance can be improved if the magnetic field formed when the high-side is active (ON) is offset when the low-side is activated (turned ON).

FIGS. 4A and 4B show a layout of interleaved devices. As shown in FIGS. 4A and 4B, instead of grouping high-side and low-side components as shown in FIGS. 3A and 3B, the high-side switches S401a, S401b, S401c and low-side switches S402a, S402b, S402c are interleaved sharing a common output 410 or an overlapping output. The interleaving establishes a mutual inductance in the common output 410 so that the current flowing I401, I402 in each of the high-side switches S401a, S401b, S401c and low-side switches S402a, S402b, S402c is equal in magnitude.

The interleaving of the high-side switches S401a, S401b, S401c and low-side switches S402a, S402b, S402c minimizes leakage inductance. For example, when the conductors are spread far apart as is the case in the grouped device example of FIGS. 3A, 3B, there is a relative large amount of leakage inductance. As the mutual inductance is increased with the interleaved design, a high frequency transformer is formed.

Additionally, the interleaved design provides for conductors being near one another. A substantial amount of capacitance is present between the overlapping conductors. This capacitance provides high frequency decoupling. The interleaved and overlapped conductors function as a distributed capacitor.

While illustrated with a high-side comprising three parallel high-side switches S401a, S401b, S401c and the low-side comprising three parallel low-side switches S402a, S402b, S402c, other numbers of parallel switches can be employed.

The high-side switches S401a, S401b, S401c and low-side switches S402a, S402b, S402c are interleaved as shown in FIGS. 4A, 4B. The high-side conductors and low-side conductors are on stacked layers, each of the high-side and the low-side being on a respective layer. For a two-layer printed circuit board (i.e., two conductor layers and one dielectric layer), one conductor layer is provided for the high-side and one conductor layer is provided for the low-side, although more layers can be used. For example, instead of the B+/B− layers, where B+ represents the high side and B− represents the low-side, in a two-layer implementation, a four layer implementation would be B+/B−/B+/B−. The more layers that are used, the better the coupling will be between the layers.

The multilayer layout with interleaved high-side and low-side switches maintains the currents I410/I402 generally on top of each other because the conductor traces of the multilayer printed circuit board overlap. This layout minimizes an amount of the magnetic field that has to change when switching from the low-side to the high-side and vice versa. The interleaving and the minimization of the field dramatically reduces the net energy released during a switching event, thereby reducing over voltage and allowing faster switching speeds.

While FIGS. 4A and 4B show the high-side switches S401a, S401b, S401c and low-side switches S402a, S402b, S402c on a first face of the printed circuit board 400, the high-side switches S401a, S401b, S401c and low-side switches S402a, S402b, S402c can be arranged on opposite faces of the printed circuit board 400. It should be note that even when arranged on opposite faces of the printed circuit board 400 the high-side switches S401a, S401b, S401c and low-side switches S402a, S402b, S402c are interleaved.

A controller 425 is communicatively coupled to the high-side switches S401a, S401b, S401c and low-side switches S402a, S402b, S402c to provide control signals to the high-side switches S401a, S401b, S401c and low-side switches S402a, S402b, S402c. The control signals turn the respective switches on and off with a same or different timing. The controller is a microprocessor with memory or the like, or a microcontroller or the like.

Figure 5:
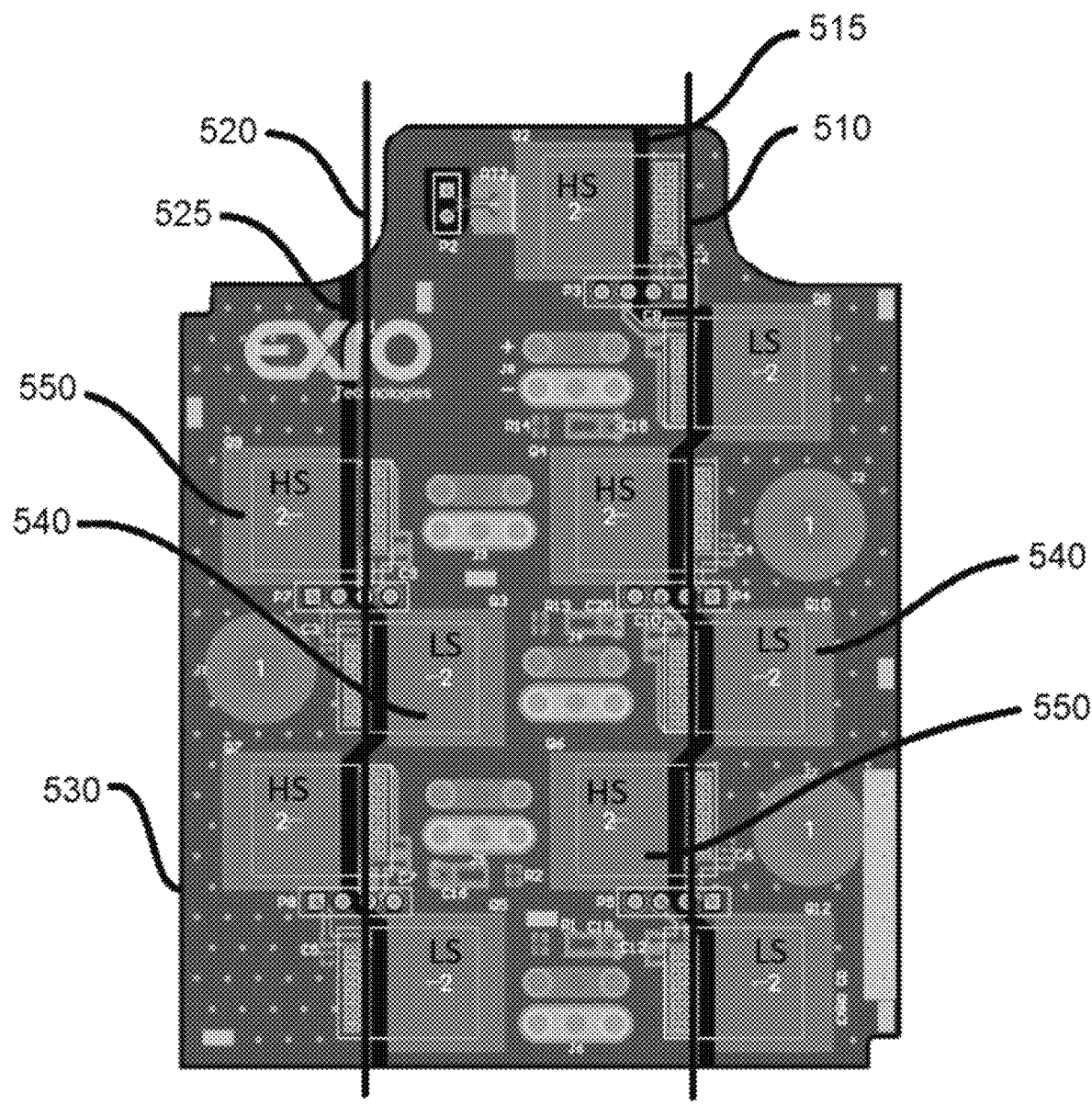
FIG. 5 is top plan view of a printed circuit board for a power module, according to at least one illustrated implementation.

FIG. 5 is an exemplary printed circuit board 530 for a power module. As shown, the mounting pads for high-side switches 550 (HS) and the mounting pads for the low-side switches 540 (LS) are interleaved and staggered side-to-side with respect to common output lines 515, 525. This layout achieves a power switching stage capable of 500a turn OFF in 60 nS with about 6 volts of overshoot.

The printed circuit board 530 is typically made from an FR4 epoxy laminate and prepreg, polyimide laminates and prepreg, Teflon laminates and bonding plies, ceramics, and the like. Prepreg is a thin glass fabric that is coated with resin and dried. Typically, a multilayer printed circuit board is utilized. Copper cladding is used for the conductive traces.

According to one aspect of the invention, the printed circuit board 530 can be manufactured using direct bonded copper (DBC), active metal braze (AMB), or Insulated metal substrate (IMS) technology. DBC and AMB substrates for printed circuit board 530 use ceramic substrates, typically made from a material in the aluminum oxide family, aluminum nitride, or beryllium oxide. DBC and AMB substrates are typically produced without joint layer that might increase thermal resistance. DBC substrates are used in power modules because of their thermal conductivity.

DBC substrates are composed of a ceramic substrate, commonly alumina, with one or more sheet of copper bonded to one or both sides by a high-temperature oxidation process. The copper layers can be preformed prior to firing or chemically etched using printed circuit board technology to form an electrical circuit.

IMS substrates comprise a metal baseplate, commonly aluminum, covered by a thin layer of dielectric, usually an epoxy-based layer, and a layer of copper. For the present application, multiple dielectric and copper layers are preferred for coupling between the conductors.

As shown, the printed circuit board 530 has mounting pads 550 for five high-side switches HS and mounting pads 540 for five low-side switches LS. The printed circuit board 530 has three mounting pads for high-side switches HS and three low-side switches LS arranged on either side of imaginary line 510. Each of these mounting pads are arranged so that an output of the respective high-side or low-side switch HS, LS is fed to common output line 515. While a single common output line 515 is shown, there are overlapping output conductors, one for the high-side switches HS and one for the low-side switches LS. The printed circuit board 530 also has two mounting pads 550 for high-side switches HS and mounting pads 540 for two low-side switches LS arranged on either side of imaginary line 520. Each of these mounting pads is arranged so that an output of the respective high-side switch HS or low-side switch LS is fed to common output line 525. Again, the common output line 525 comprises overlapping conductors and the mounting pads for the high-side and low-side switches are interleaved. The common output lines 515, 525 generally correspond to the conductor 410 in FIGS. 4A, 4B. Further, according to one aspect of the invention, the high-side and low-side switches alternate or are interleaved along a length of the common output lines 515, 525.

In the above description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with power systems, power converters, power modules, and power supplies have not been shown or described in detail to avoid unnecessarily obscuring descriptions of the implementations.

The various embodiments described above can be combined to provide further embodiments. Aspects of the implementations can be modified, if necessary, to employ systems, circuits and concepts of the various patents, applications and publications identified herein to provide yet further implementations.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method acts that perform substantially the same function in substantially the same way to achieve the same results are within the scope of the invention. Moreover, it should be recognized that structures and/or elements and/or method acts shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An article for a power inverter, the article comprising: a multilayer printed circuit board comprising a first electrically conductive wiring layer, at least a second electrically conductive wiring layer, and at least a first dielectric layer interposed between the first and the second electrically conductive wiring layers, the first electrically conductive wiring layer comprising a first common input line and the second electrically conductive wiring layer comprising a second common input line, the first and the second common input lines at least partially overlapping one another in a projection along a thickness of the multilayer printed circuit board, a first set of input mounting pads carried by the first common input line, a second set of input mounting pads carried by the second common input line; the input mounting pads of the second set of input mounting pads alternatingly interleaved with the input mounting pads of the first set of input mounting pads along a first axis, the first axis which is perpendicular to the thickness of the multilayer printed circuit board, the article further comprising a common output line and a set of output mounting pads carried by the common output line; a first set of switches, each of the switches of the first set of switches having a first node and a second node, the first node of the switches of the first set electrically coupled to respective ones of one or more of the input mounting pads of the first set of input mounting pads, and the second node of the switches of the first set electrically coupled to respective ones of one or more of the output mounting pads of the set of output mounting pads; and a second set of switches, each of the switches of the second set of switches having a first node and a second node, the first node of the switches of the second set electrically coupled to respective ones of one or more of the input mounting pads of the second set of input mounting pads, and the second node of the switches of the second set electrically coupled to respective ones of one or more of the output mounting pads of the set of output mounting pads.

2. The article of claim 1 wherein the second electrically conductive wiring layers is spaced sufficiently close to the first electrically conductive wiring layer to electromagnetically couple the first and the second electrically conductive wiring layers together when a current flows through at least one of the second electrically conductive wiring layers.

3. The article of claim 1 wherein the first common input line is interdigitated along a first edge thereof and exposes portions of the second common input line between digits of the first common input line.

4. The article of claim 3 wherein the input mounting pads of the first set of input mounting pads are carried on respective ones of the digits of the first common input line and the mounting pads of the second set of input mounting pads are in contact with the second common input line.

5. The article of claim 1 wherein the output mounting pads of the set of output mounting pads are spaced from the input mounting pads of the first and the second sets of input mounting pads along a second axis, the second axis orthogonal to the first axis and the thickness of the multilayer printed circuit board.

6. The article of claim 1, wherein at least one of the first or the second electrically conductive wiring layer comprises the common output line, the common output line electrically isolated from the first and the second common input lines except via the switches of the first and the second sets of switches.

7. The article of claim 1, wherein the multilayer printed circuit board comprises at least a third electrically conductive wiring layer, and at least a second dielectric layer interposed between the third first electrically conductive wiring layer and at least one of the first or the second electrically conductive wiring layers, the third electrically conductive wiring layer comprising the common output line which is electrically isolated from the first and the second common input lines except via the switches of the first and the second sets of switches.

8. The article of claim 1, further comprising:
a controller communicatively coupled to provide control signals to the switches of the first and the second sets of switches, the controller which provides control signals to places the switches of the second set of switches in the opposite state from the switches of the first set of switches.

9. The article of claim 1, wherein the switches of the first and the second sets of switches are switches configured as integrated gate bipolar transistors (IGBTs) or metal oxide semiconductor field effect transistors (MOSFETs).

10. The article of claim 1 wherein the first and the second common input lines completely overlap one another in the projection along the thickness of the multilayer printed circuit board.

11. An article for a power inverter, the article comprising:
a multilayer printed circuit board comprising a first electrically conductive wiring layer, at least a second electrically conductive wiring layer, and at least a first dielectric layer interposed between the first and the second electrically conductive wiring layers, the first electrically conductive wiring layer comprising a first common output line and the second electrically conductive wiring layer comprising a second common output line, the first and the second common output lines at least partially overlapping one another in a projection along a thickness of the multilayer printed circuit board, a first set of output mounting pads carried by the first common output line, a second set of output mounting pads carried by the second common output line; the output mounting pads of the second set of output mounting pads alternatingly interleaved with the output mounting pads of the first set of output mounting pads along a first axis, the first axis which is perpendicular to the thickness of the multilayer printed circuit board, and the first electrically conductive wiring layer comprising a first common input line and the second electrically conductive wiring layer comprising a second common input line, a first set of input mounting pads carried by the first common input line, a second set of input mounting pads carried by the second common input line, a first set of semiconductor switches, each of the semiconductor switches of the first set of semiconductor switches having a first node and a second node, the first node of the semiconductor switches of the first set electrically coupled to respective ones of one or more of the input mounting pads of the first set of input mounting pads, and the second node of the semiconductor switches of the first set electrically coupled to respective ones of one or more of the output mounting pads of the set of output mounting pads; and a second set of semiconductor switches, each of the semiconductor switches of the second set of semiconductor switches having a first node and a second node, the first node of the semiconductor switches of the second set electrically coupled to respective ones of one or more of the input mounting pads of the second set of input mounting pads, and the second node of the semiconductor switches of the second set electrically coupled to respective ones of one or more of the output mounting pads of the set of output mounting pads.

* * * * *